(12) United States Patent
Voss

(10) Patent No.: US 7,183,215 B2
(45) Date of Patent: Feb. 27, 2007

(54) ETCHING WITH ELECTROSTATICALLY ATTRACTED IONS

(75) Inventor: Curtis L. Voss, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 146 days.

(21) Appl. No.: 10/895,733

(22) Filed: Jul. 21, 2004

(65) Prior Publication Data

US 2006/0016784 A1 Jan. 26, 2006

(51) Int. Cl.
*H01L 21/311* (2006.01)

(52) U.S. Cl. .................. 438/700; 438/706; 438/719

(58) Field of Classification Search ............... None
See application file for complete search history.

(56) References Cited

U.S. PATENT DOCUMENTS

| | | | |
|---|---|---|---|
| 4,886,569 A | 12/1989 | Ojha et al. | |
| 5,094,712 A | 3/1992 | Becker et al. | |
| 5,176,790 A | 1/1993 | Arleo et al. | |
| 5,728,619 A | 3/1998 | Tsai et al. | |
| 6,162,583 A | 12/2000 | Yang et al. | |
| 6,174,451 B1 | 1/2001 | Hung et al. | |
| 6,203,715 B1 | 3/2001 | Kim et al. | |
| 6,217,786 B1 | 4/2001 | Hills et al. | |
| 6,380,095 B1 * | 4/2002 | Liu et al. | 438/719 |
| 6,656,847 B1 | 12/2003 | Lin et al. | |
| 2001/0044213 A1 * | 11/2001 | Pandhumsoporn et al. | 438/712 |
| 2002/0132389 A1 * | 9/2002 | Patel et al. | 438/97 |
| 2004/0100677 A1 | 5/2004 | Huibers et al. | |
| 2005/0057792 A1 * | 3/2005 | Wang et al. | 359/290 |

FOREIGN PATENT DOCUMENTS

| | | |
|---|---|---|
| EP | 0 862 206 A | 9/1998 |
| WO | WO 02/12116 A | 2/2002 |
| WO | WO 02/062202 A | 8/2002 |

* cited by examiner

*Primary Examiner*—Duy-Vu N. Deo

(57) ABSTRACT

A technique comprises directing a plasma having at least first and second gasses at a substrate. The substrate is at least partially covered with at least the first and second layers. Ions of the first gas are electrostatically attracted towards the substrate. The second gas selectively etches the first layer relative to the second layer.

9 Claims, 4 Drawing Sheets

ETCHING WITH ELECTROSTATICALLY ATTRACTED IONS

BACKGROUND

Etching apertures in materials such as silicon involves the use of etchants that usually lack etch-directionality, and thereby etch in all direction at the same rate within the etched silicon. As such, it is difficult to etch high aspect ratio apertures in silicon.

BRIEF DESCRIPTION OF THE DRAWINGS

The same numbers are used throughout the drawings to reference similar features and components.

DETAILED DESCRIPTION

This disclosure provides a number of techniques to form metal vias. Within this disclosure, the term "metal via" is inclusive of support metal vias as described with respect to FIGS. 1a, 1b, 1c, and 1d, and interconnect metal vias as described with respect to FIG. 4. Metal vias are formed in via apertures of a silicon layer 702. Interconnect metal vias extend vertically through a non-sacrificial, silicon layer 702 which remains following processing. The silicon layer 702 of the interconnect metal vias therefore exists within the final electronic device.

The "support metal vias" are formed in a sacrificial silicon layer. After the support metal vias are formed by metallizing apertures formed in the silicon layer, then the sacrificial silicon layer is removed by etching. The support metal vias remain as free-standing metallized structures that support such micro-electromechanical (MEM) devices as fully-reflective or partially reflective plates for optical modulators. Optical modulators and/or MEM devices that use metal vias can be used in such diverse technologies as display or projector devices, and communication systems.

Any metal via that extends through and is formed at least partially within a silicon layer (the sacrificial layer being sacrificial or non-sacrificial) is within the intended scope of one embodiment of the present disclosure, whether the metal via is an interconnect metal via, a support metal via, or any other type of metal via. A silicon wafer process can be used to process the substrate to produce metal vias in silicon.

The techniques to form metal vias disclosed herein may be used to form devices other than micro-mirror devices.

Exemplary Metal Via Fabrication

This disclosure describes in one embodiment with respect to FIGS. 1a to 1d is a fabrication technique that is used to form a high aspect ratio via aperture in a silicon layer. The fabrication technique can be used to form support metal vias, interconnect metal vias, and any other type of via. After forming the via aperture as an aperture formed in a silicon layer, a via such as a support metal via 24 of FIG. 1d can be formed by metallization of the surface area around the via aperture. The outer periphery of the via is formed/defined by a wall forming the via aperture. While the embodiment of FIGS. 1a, 1b, 1c, and 1d is described with respect to fabricating the support metal via, it is envisioned that these concepts can be applied to fabricating the interconnect via as described with respect to FIG. 4, or any other metal via that is formed in a via aperture within a silicon layer.

Figure 1A:
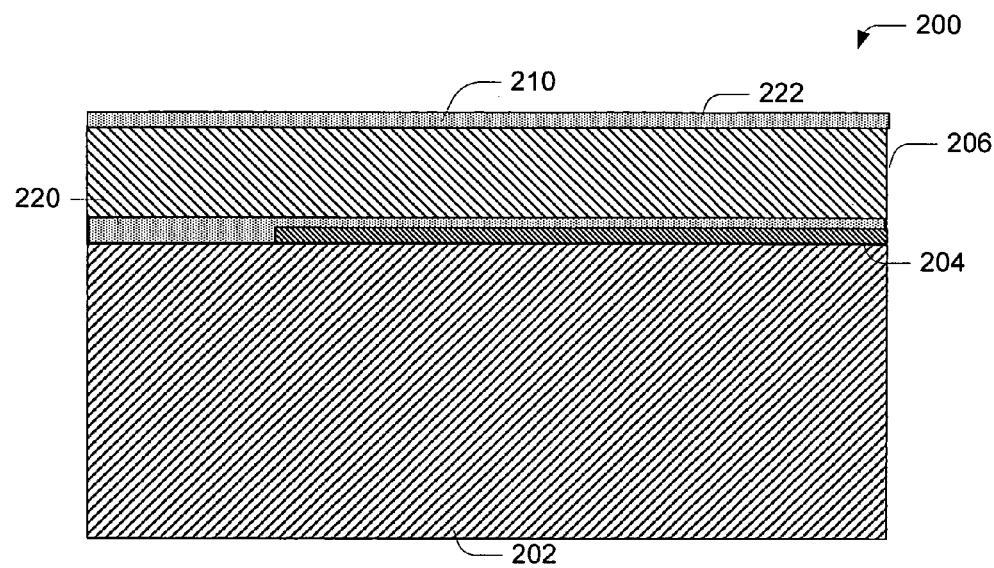
FIGS. 1a, 1b, 1c, and 1d are side cross-sectional views showing different respective views of one embodiment of the fabrication of one or more metal vias.

FIG. 1a shows a cross-sectional view of a wafer 200 formed from a number of layers including a silicon substrate 202, an electrically conductive layer such as an integrated circuit (IC) metal layer 204, and a silicon layer 206. During processing, the metal layer 204 is deposited as a planar layer on the silicon substrate 202, and the patterned metal layer 204 is etched and patterned to form IC circuitry in the desired configuration using techniques that are generally known in Ultra Large Scale Integrated Circuits (ULSI). The metal layer 204 is formed from a metal such as Aluminum Copper (AlCu) that forms a conductive patternable layer. Within this disclosure, the metal layer 204 is formed from any metal that resists etching by a plasma, wherein the plasma is used to form the silicon via aperture.

In one embodiment, each metal layer 204 is formed using fabrication techniques that produce a combination of aluminum metal traces, polysilicon gatelines, and silicon. Each metal layer 204 performs electronic operations based on the configuration, structure, and control of the application of electricity to the selected locations of the metal layer. In certain embodiments that are not shown, there can be a number of metal layers 204 that are vertically spaced within the wafer 200 by one or more interconnect metal vias at desired locations.

Figure 1B:
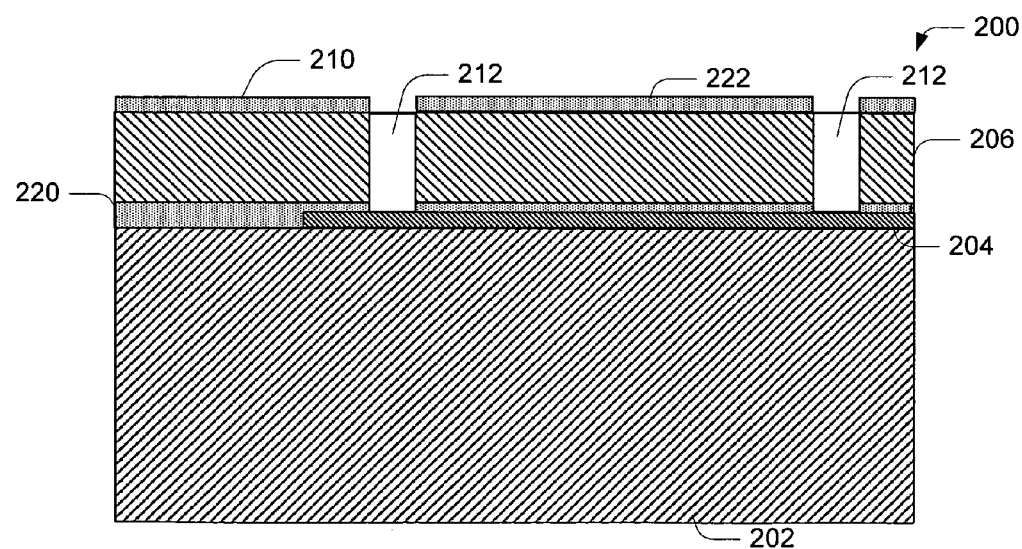

In one embodiment, each one of a lower diffusion barrier layer 220 and an upper diffusion barrier layer 222 are made from titanium nitride (TiN). After the uppermost metal layer 204 is formed, a lower diffusion barrier layer 220 is deposited on the metal layer 204. The lower diffusion barrier layer 220 is located between the silicon layer 206 and the metal layer 204. An upper diffusion barrier layer 222 is located on top of amorphous silicon of the silicon layer 206. The diffusion barrier layers 220 and 222 are optional, and act to reduce the diffusion of the metal (e.g., aluminum) that are contained within the respective metal layers 42 and 204 into the silicon layer 206. Depending upon the particular processing, either or both diffusion barrier layers 220 and 222 may remain following processing in the final micro-mirror device 10 as shown in FIG. 1d.

The silicon layer 206 is deposited above the metal layer 204 and the lower diffusion barrier layer 220 using metal deposition techniques such as chemical vapor deposition (CVD). Following the deposition of the silicon layer 206, an upper surface 210 of the silicon layer 206 may be planarized such as by chemical metallization polishing (CMP). The upper diffusion barrier layer 222 is then deposited on the upper planarized surface of the silicon layer 206. A planar lower surface 41 of the reflective element 42 forms as a result of the planarized upper surface 210 of the silicon layer.

In one embodiment, the chemistry of the plasma allows selective etching of the via apertures through: a) the upper diffusion barrier layer 222, b) the silicon layer 206, and c) the lower diffusion barrier layer 220 relative to the metal layer 204. Within this disclosure, selective etching of the silicon layer relative to the metal layer means that the process can etch through the entire silicon layer, while etching a lower percentage of the metal layer. In the embodiment of FIG. 1b, the via apertures 212 are formed in the silicon of the sacrificial silicon layer 206. In this disclosure, each via aperture 212 represents a void surrounded by walls that are etched in the silicon substrate. To form a via in any via aperture, metal is deposited on a surface such as the diffusion barrier layer 220 that contains an opening to the via aperture. The outer surface of the via conforms to the shape of the wall of the via aperture. After the support metal vias 24 are formed by metallization in the sacrificial silicon layer 206, the sacrificial silicon layer is etched away. While this disclosure describes particularly etching via apertures in silicon that are used to form vias, the concepts described herein can be used to etch any aperture in silicon.

This etching through the silicon layer 206 can be performed to form the via aperture down to the metal layer 204, with relatively little etching in the metal layer. This etching thereby defines the outline of the via formed in the via aperture 212 that extends through the silicon layer 206 downward to the metal layer 204. By forming the via down to but not through the metal layer 204, an electrically conductive path is formed from the metal layer through the metallized via formed using the via aperture. When the via aperture 212 is metallized, the metal forming the metal via 24 provides an electrical conductor from the upper surface (such as from the metal reflector element 42 as shown in FIG. 1d) down to the metal layer 204. In certain embodiments where the silicon layer 206 is removed following the formation of the via (e.g., the silicon layer is a sacrificial silicon layer), the metal via 24 also provides support for the reflective element 42 with respect to the metal layer 204. The electrically-conductive metal of the metal via provides the functionality of the conductive via.

The metal layer 204 of FIGS. 1a, 1b, 1c, and 1d may be formed as either a continuous or discontinuous member. As such, the two support metal vias 24 as shown in FIG. 1d can be in electrical communication with a separate portion of the metal layer 204, and may be held at different potentials without shorting as a result of the integrated circuit structure of the metal layer 204.

Chlorine chemistries such as $BCl_3$ work well to etch TiN and silicon; however such chemistries when used alone may overetch downwardly through the metal of the metal layer 204 when acting alone. As described with respect to FIG. 1b, the via aperture 212 is etched primarily in a vertical direction within the silicon of the silicon layer 206 downwardly in the general direction of the substrate 202 to the metal layer 204. Additionally, since it is uncertain how much etching is necessary to etch down to the metal layer when $BCl_3$ is used alone, the etching will etch more in the horizontally direction to provide a relatively wide via aperture which has a low aspect ratio. The via aperture 212 of FIG. 1b defines the outline in which to form the outer surface of the metal via 24 of FIG. 1d. It is beneficial in many instances to form the metal via 24 with a high aspect ratio (i.e., the height divided by the width of the via) and/or a more consistent cross-section. As such, in many instances, it is also desirable to form via apertures 212 that form the metal vias with a high aspect ratio and/or a more consistent cross-section.

Within this disclosure, the term "etch directionality" indicates that the etchant can etch primarily in a single direction within the material being etched (e.g., the silicon layer 206), instead of etching in all directions that the etchant contacts the material being etched. More particularly the etching of the via aperture 212 as shown in FIG. 1b is directed substantially downwardly towards the substrate instead of a combination of downwardly and horizontally, as a result of the electrostatic attraction of ions contained in the etchant that are attracted in a substantially downward direction. In one embodiment, the via aperture 212 is formed more cylindrically so that the metal via has a more consistent cross-section, as compared to the more frustro-conical shape that occurs when more horizontal etching occurs near the top of the aperture then near the bottom of the aperture. With a more uniform cross section, the bending operation of the via that, for example, results in the tilting of the micro-mirror device 10 as shown in FIG. 1d, is more predictable and consistent between different devices. In addition, such uniformity of cross-sectional configuration reduces the formation of curves and shoulders in the via formed within the via aperture that result in increased stress concentration areas being produced in the metal via 24 (resulting from varying structural dimensions). By using an etchant that etches through the silicon layer 206 with a high degree of directionality, the cross sectional dimension of the via aperture 212 can be formed more uniformly through the silicon layer 206 with an increased aspect ratio.

In one embodiment, the via aperture 212 is etched in the silicon layer 206 using a plasma formed from combined chemistries of a first gas and a second gas. During fabrication, the first gas contains ions and provides etch directionality in a direction towards an oppositely-charged or grounded material of the silicon wafer 200 or the silicon substrate 202. In this disclosure, certain embodiments of the first gas include, but are not limited to, tricholorborane ($BCl_3$) or argon. The second gas of the plasma causes the etchant to selectively etch the silicon relative to the metal layer wherein in one embodiment, the via apertures 212 are etched through the silicon, and the etching is stopped on the metal layer with no or little etching of the metal layer. Certain embodiments of the second gas include, but are not limited to, gasses that have fluorine as a precursor, flourocarbo type etch gasses, and more particularly sulfur hexafluoride ($SF_6$), $NF_3$, $CF_4$, $CHF_3$, or $C_3F_8$. Within this disclosure, the first gas is described as $BCl_3$ and the second gas is described as $SF_6$, even though any of these other gasses are within the intended scope of the present disclosure.

The chemistry of this plasma improves the selectivity of the silicon layer relative to the AlCu forming the electrically conductive or the metal layer 204 as compared to chlorine and $BCl_3$ chemistries. As such, the plasma formed from the $BCl_3$ and the $SF_6$ etches quite efficiently through the silicon of the silicon layer 206 to form the apertures, but does not etch as rapidly through the metal layer 204. The chemistry enables etching of a film stack composed of a TiN refractory metal or similar refractory barrier material and the silicon of the silicon layer 206. Since the etching process allows relatively quick and efficient etching through the silicon layer but not through the metal layer, the duration of the etching is reduced, and the resulting horizontal etching within the aperture is reduced. By reducing the horizontal etching, the aspect ratio of the resultant vias is improved.

This etching process as described herein also permits stopping the etching as a metal film layer, such as when the metal layer 204, is reached. This ending of the etching on the metal layer 204 reduces over-etching in which the material below the metal layer is etched. By stopping etching when the metal layer is reached as detected by an increased etch rate as described with respect to FIG. 2, the amount of outward etching within the via aperture 212 above the metal layer is also reduced.

The etching process enables more precise etching different sizes of metal vias, and etching vias in different thicknesses of silicon on the same wafer without significantly over-etching through the metal layer 204. The etching process occurs during a single plasma etch step under vacuum promoting desirable profiles and reduces the possibility of corrosion from residual chlorides. The described process also has good selectivity to photoresist such that small metal vias can be etched with desirable profile for subsequent sputtered metal deposition.

The addition of $BCl_3$ into the plasma provides directionality to the etching associated with using $SF_6$ only. The directionality of the etching using $BCl_3$ is achieved by the formation of positive ions within the plasma. The gas, $SF_6$, typically does not form positive ions in a plasma so when using this gas, the etch is isotropic or non-directional in nature. The addition of $BCl_3$ in the plasma creates positive ions, $BCl_3^+$ and $BCl_2^+$. These positive ions are then accelerated downwardly into the silicon material being etched towards the grounded or electrically biased material of the wafer 200 or the substrate 204 because the wafer 200 or substrate material is either grounded, or held at a negative voltage bias during the etching. The majority of the volume of the substrate 202 is located physically below the material of the silicon layer 206 that is being etched. As such, biasing the substrate 202 acts to propel the ions within the plasma in a generally downward direction towards the oppositely-charged or neutral substrate. Any portion of the wafer 200 that is located below the silicon layer 206 may also be oppositely or neutrally charged relative to the ions contained in the plasma to drive the ions downwardly through the silicon layer 206, and thereby be used to etch the silicon layer to provide etch directionality in a generally downward direction. As such, the term "substrate" as referenced in this disclosure as 202 may apply to any element within the wafer 200 that is generally below the silicon layer 206. For example, in another embodiment, the entire wafer 200 whose center is below that of the silicon layer 206 can be grounded or held at a negative voltage bias relative to the ions in the plasma. The resulting ion bombardment that provide etch directionality from these dominant ions towards the wafer 200 or suitable substrate material, such as quartz glass, results in etch directionality using the plasma that is not achieve with a $SF_6$ plasma alone. As such, the addition of the ions of the $BCl_3$ gas to the plasma including $SF_6$ is viewed as providing etch directionality that allows the etchant to etch in a direction towards the oppositely or neutrally charged material of the substrate 202 down to the metal layer 204.

The material of the substrate 202 acts to attract the ions in the plasma. For a given pair of charges in the substrate and the plasma material, closer spacing results in an increased attraction force. While it is true that many portions of the substrate 202 and the wafer 200 are not located exactly below the portion of the silicon layer that is being etched with the plasma, there is some horizontal component offset effect to material that is located on opposite lateral sides of the substrate 202 (or the wafer). The charged or grounded materials that are equally offset in lateral directions within the substrate tend to cancel horizontal component of forces being applied to the ions in the plasma, thereby providing a generally downward force to the ions in the plasma into the silicon layer 206 (that also provides for the generally downward etch directionality).

This disclosure provides etching processes that provide etch directionality, largely as a result of the electrostatic attraction of the ions contained in the etchant of the plasma. Additionally, the etching process makes it possible to stop the etching on a metal layer. Combining the $SF_6$ with the chlorine-based $BCl_3$ reduces the possibility of etching through the metal layer as would occur with etching with $BCl_3$ alone, and is thereby considered to causes the etchant to selectively etch the silicon relative to the metal layer.

Figure 1C:
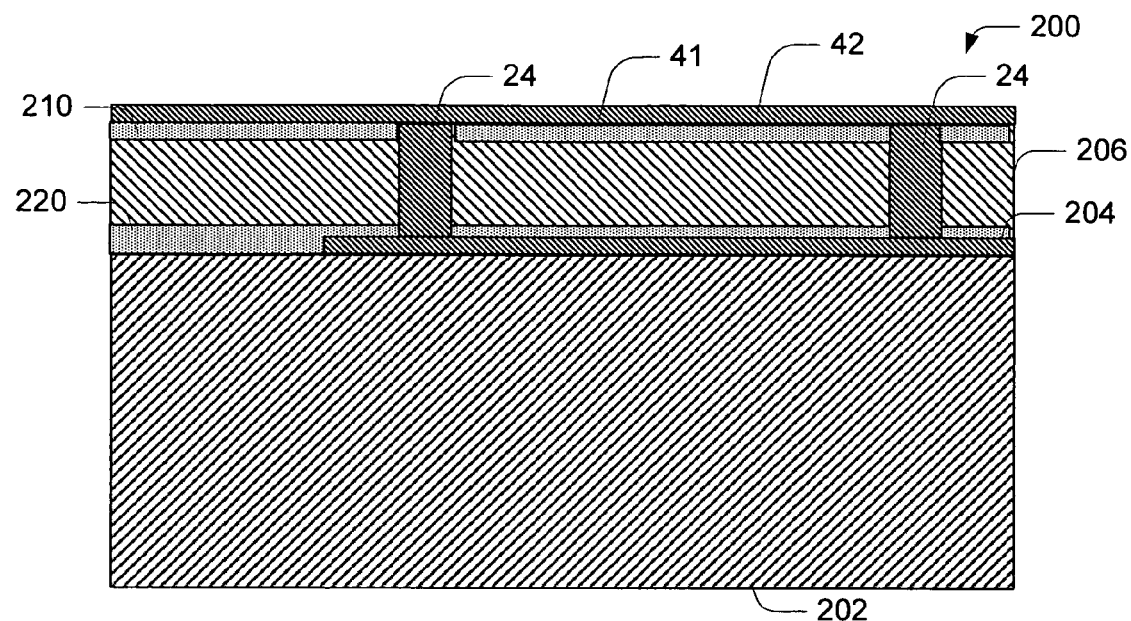
Figure 1D:
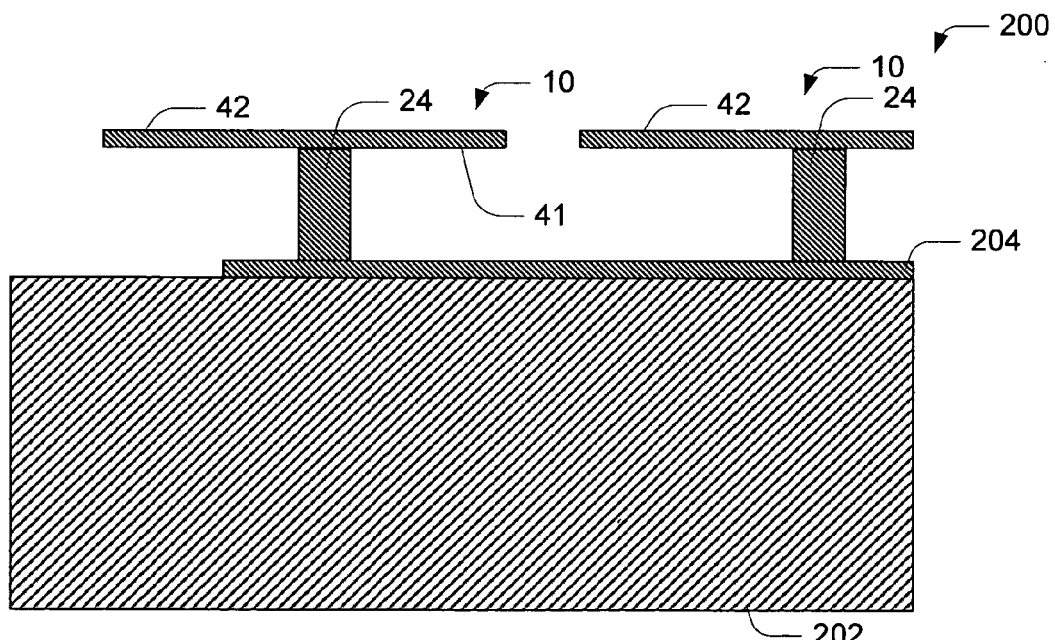

FIG. 1c shows one embodiment of depositing electrically conductive material on top of the sacrificial silicon layer 206, and in electrical contact with the metal via 24 that is formed as described with respect to FIG. 1b. The sacrificial silicon layer 206 is still in position such that both the metal via 24 and the reflective element 42 are formed using the sacrificial silicon layer 206. The reflective elements of an entire array of reflective elements can be formed from depositing layers of the materials of the desired electrical, reflective, and structural characteristics. The deposited planar layers are etched by patterning to form horizontally-extending arrays of reflective elements such as micro-mirrors. Each reflective element 42 in the array of reflective elements that are formed from the deposited layer of materials can be individually actuated.

FIG. 1d shows the sacrificial silicon layer 206 being removed by etching to leave a free-standing and fully-functional micro-mirror device 10. During fabrication, the reflective element 42 is provided with a flexibility with respect to the metal layer 204 that allows each reflective element to be displaced (often using electrical biasing to exert a force to the reflective element) with respect to other reflective elements. Any etching technique that etches silicon while not etching metal in those instances where the deposited layers of material to form the reflective element 42, the metal via 23, and the metal layer 204 are each metal may be used to remove the sacrificial silicon layer. Further processing steps are used to form the glass transparent plate (not shown) that acts as a packaging portion to protect the mirror during normal operations.

Figure 2:
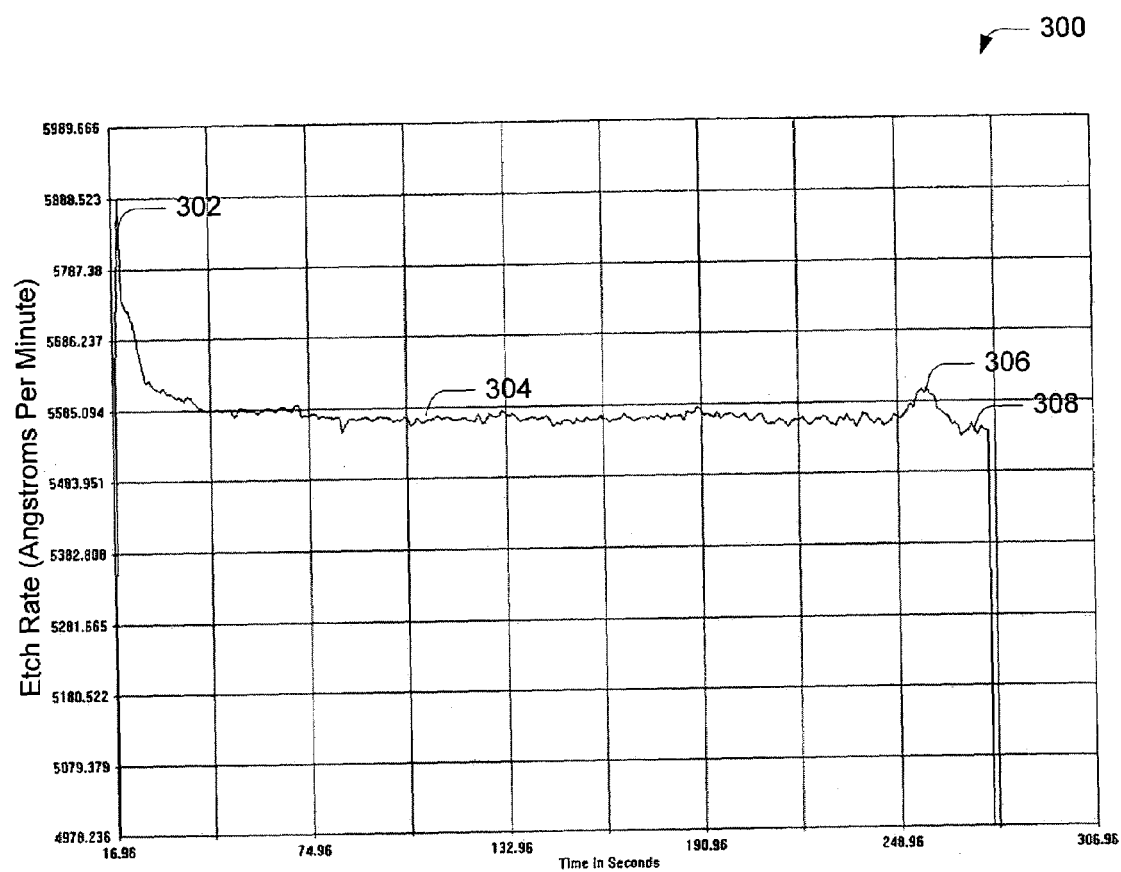
FIG. 2 shows a graph of etch rate versus time in one embodiment of a higher directionality etching process, according to an example embodiment.

FIG. 2 outlines one embodiment of a higher directionality etching process 300 that is used to etch the via aperture 212 within the silicon layer. FIG. 2 is known as an endpoint trace, and is an optical emission of the etching process 300. FIG. 2 is illustrative in nature based on a particular plasma and silicon configuration, and is not intended to be limiting in scope. The particular etch-rates, as shown in Table 1 below, are exemplary for the etching process 300. The higher directionality etching process 300 starts at 302 with clearing the upper diffusion barrier layer 222 as described with respect to FIG. 1a at one measured rate that can be measured in Angstroms per minute. The higher directionality etching process 300 continues its etching at 304 by clearing through the amorphous silicon forming the silicon layer 206. The higher directionality etching process 300 continues to clear the lower diffusion barrier layer 220 at 306. During 306, the etch rate differs (is slightly lower, though the etch rate is not shown in FIG. 2) from the etch rate of 304. This variation in the etch rate is detectable by a skilled operator and/or a microprocessor-based controller. As such, the detected slight change in the etch rate can be used to determine when the etching down to the metal layer is complete. The etching of the lower diffusion barrier layer 220 can be detected using, e.g., optical-emission spectroscopy as being slightly different than that of the silicon layer 206. An over-etch into the metal layer 204 would occur at 308 at a slower rate than that for the lower diffusion barrier layer 220, but the etching is ended prior to the over-etching.

As such, when the etch rate drops following the etching of the lower diffusion barrier layer 220 as determined by the optical-emission spectroscopy, then the etching process should be completed because the metal layer 204 is exposed through the via aperture. As soon as the metal layer is exposed, then the higher directionality etching process 300 is complete and the further processing can be performed.

Figure 3:
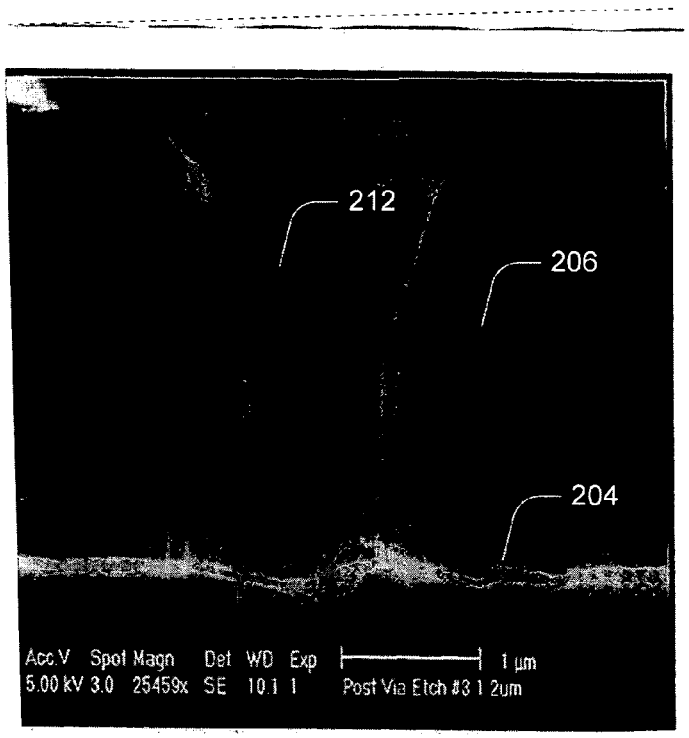
FIG. 3 is a photograph of one embodiment of a metal via formed in a silicon layer of one embodiment of the present invention.

One embodiment of the process involves using two different types of etch tools to form the plasma that can improve the degree of directionality of the etching in the silicon layer 206 down to the metal layer 204. For example, the plasma uses the silicon and metal etch characteristics of the $Cl_2$ chemistry along with the directionality of the $BCl_3$ chemistry to form the plasma that is used to etch through the TiN barrier diffusion layers 222, 220 and the silicon layer 206 down to the metal layer 204. A different etch tool is then used with a high selectivity to metal. This technique minimizes the over etch into the metal layer 204 as shown in the photograph of FIG. 3. This technique provides for stopping the etch process at a consistent etch depth with respect to the upper surface of the metal layer 204. The etch rate through the TiN diffusion barrier layer 220 at the bottom of the metal via is slow and maintaining adequate resist for deep metal vias is difficult. As shown in the photograph of FIG. 3, the etched side walls of the via aperture 212 are etched to have walls that are mostly vertical due to the relative high degree of directionality of the etchant in a downward direction.

The plasma as provided in this disclosure provides for reasonably good etch rate of silicon and TiN or similar refractive metal barrier film with good selectivity to the metal layer 204. The plasma as described provides for etching of silicon down to and stopping on the integrated metal layer 204 using one etching tool and a continuous etching process. An illustrative via etching process that is described with respect to Table 1 is shown in FIG. 2. In general, the two-to-one concentration of $BCl_3$ with respect to $SF_6$ is applied in TABLE 1 and has been found to be effective. Any other relative concentration of $BCl_3$ and $SF_6$ is within the intended scope of the present disclosure. As the relative concentration of $SF_6$ is increased and/or the relative concentration of $BCl_3$ is reduced, the walls of the via apertures 212 generally angle more from vertical due to a decrease in etch directionality, and more horizontal etching near the top of the aperture. This etching technique using the plasma as described with respect to Table 1 allows flexibility to etch silicon in an etcher for metal.

TABLE 1

Exemplary Plasma Etching Recipe

Etching with a Metal Etcher, such as the 9600SE Process Chamber that is commercially available from LAM Research of Fremont CA.
Amorphous Silicon etch rate 6000–4800 Å/min
Photoresist etch rate ~3000–5000 Å/min
Titanium Nitride (TiN) etch rate 3600 Å/min
Aluminum etch rate ~175 Å/min
Pressure: 7.5 mTorr
Power applied to upper electrode in chamber: 350 W
Power applied to lower electrode in chamber that connects to the silicon substrate 202 or other portion of the wafer: 75 W or less of opposite polarity of upper electrode.
Note: power levels applied to upper and lower electrodes in process chamber represent one effective applied value, other ranges can be determined by experimentation.
$N_2$: 0–20 standard cubic centimeters per minute (sccm)
$BCl_3$: 40 sccm
$SF_6$: 20–40 sccm
$Cl_2$: 0 sccm
He: 8 Torr
Time: 110–300 seconds
In one embodiment, the gasses are kept in separate containers to the formation of the plasma, and are combined at a nozzle assembly to form the plasma. During etching, the etchants can be heated to a desired level within the processing chamber.

Example Interconnect Metal Vias

Figure 4:
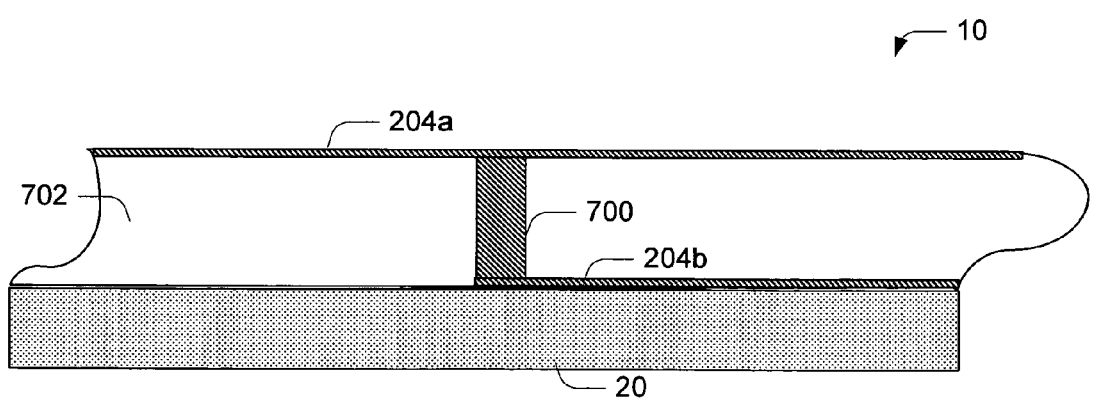
FIG. 4 is a side cross-sectional view of one embodiment of another embodiment of metal via.

The embodiment of etching techniques that are used to etch the support metal via 24 as described with respect to FIGS. 1d, 2, and 3 can also be used to etch an interconnect metal via 700 as described with respect to FIG. 4. While the sacrificial silicon layer that the support metal via is formed therein is ultimately removed in the embodiment of support metal via fabrication as described with respect to FIGS. 1a, 1b, 1c, and 1d; the silicon layer that is used to form the interconnect metal via 700 remains following processing. The support metal via 24 is a structural component that provides electrical conductivity to the reflector plate, and also physically supports the reflector plate. The interconnect metal via 700 of FIG. 4 only provides electrical conductivity between multiple metal layers 204a and 204b, and does not have to provide support which is instead provided by the silicon layer. The uniformity of the etching of the via aperture that allows for the support metal via having a more uniform cross-sectional configuration as a result of the etching with the plasma as described above allows for more consistent and predictable electrical characteristics of the interconnect metal vias.

While there are two metal layers 204a and 204b shown in FIG. 4 that are interconnected by one or more interconnect metal vias 700, it is envisioned that there may be a larger number of metal layers that are formed in vertical relation to each other with adjacent layers being interconnected by a different one or more interconnect metal via 700. The techniques by which the selected plasma reduces over-etching as described with respect to the support metal vias are applicable to reducing over-etching in the interconnect metal vias. By reducing the over-etching in the interconnect metal vias as described with respect to FIG. 1b, the possibility of an interconnect metal via extending unintentionally through multiple metal layers to create an undesired electrical connection is greatly reduced. One or more interconnect metal vias can be formed in the same IC as one or more support metal vias.

CONCLUSION

Although the invention is described in language specific to structural features and methodological steps, it is to be understood that the invention defined in the appended claims is not necessarily limited to the specific features or steps described. Rather, the specific features and steps disclosed represents preferred forms of implementing the claimed invention.

The invention claimed is:

1. A method of etching, comprising
   directing a single plasma etch having at least first and second gasses at a substrate, wherein the substrate is at least partially covered with at least first and second layers, wherein the first gas at least includes tricholorborane ($BCl_3$) and the second gas includes sulfur hexafluoride ($SF_6$);
   electrostatically attracting ions of the first gas towards the substrate, wherein the second gas selectively etches the first layer relative to the second layer at an etch rate, wherein the first layer comprises silicon and the second layer comprises an electrically conductive material; and
   detecting a drop in the etch rate by optical-emission spectroscopy to stop the etching when the second layer is exposed.

2. The method of etching of claim 1, further comprising grounding the substrate.

3. The method of etching of claim 1, further comprising applying an electrical bias to the substrate.

4. The method of etching of claim 1, further comprising:

metallizing an aperture formed in the first layer by the etching to form a metal via that extends down to the second layer and wherein the silicon is a sacrificial silicon that is removed following the formation of the metal via that electrically contacts the metal layer.

5. The method of etching of claim 1, wherein the electrostatically attracting ions of the first gas towards the substrate provides for etch directionality.

6. A method of making a micro-mirror device, comprising:

directing a single plasma etch having at least first and second gasses at a substrate having at least a first layer and a second layer, wherein the first gas at least includes tricholorborane ($BCl_3$) and the second gas is sulfur hexafluoride ($SF_6$); and etching the silicon layer by electrostatically attracting ions of the first gas into the first layer towards the substrate, wherein the second gas selectively etches the first layer relative to the second layer at an etch rate, wherein the second layer comprises an electrically conductive material, and wherein the first layer is a sacrificial layer of silicon that is removed following the formation of the metal via that electrically contacts the second layer;

detecting a drop in the etch rate by optical-emission spectroscopy to stop the etching when the second layer is exposed;

metallizing the first layer to form a metal via in an aperture formed during the etching that extends through the first layer and is connected to the second layer; and forming a reflective plate that is physically attached to the metal via, wherein the metal via physically connects and electrically couples the second layer and the reflective plate.

7. The method of etching of claim 6, further comprising grounding the substrate.

8. The method of etching of claim 6, further comprising applying an electrical bias to the substrate.

9. The method of etching of claim 6, wherein the electrostatically attracting ions of the first gas towards the substrate provides for etch directionality.

* * * * *